US012772862B2

(12) United States Patent
Hsu et al.

(10) Patent No.: US 12,772,862 B2
(45) Date of Patent: Oct. 20, 2026

(54) SELF-ALIGNED MULTIPLE PATTERNING MARK

(71) Applicant: Winbond Electronics Corp., Taichung City (TW)

(72) Inventors: Chiao-Ling Hsu, Taichung City (TW); Li-Chien Wang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 433 days.

(21) Appl. No.: 18/171,676

(22) Filed: Feb. 21, 2023

(65) Prior Publication Data

US 2023/0307377 A1 Sep. 28, 2023

(30) Foreign Application Priority Data

Mar. 22, 2022 (TW) .................................. 111110678

(51) Int. Cl.

| | |
|---|---|
| ***H10W 46/00*** | (2026.01) |
| ***G03F 7/00*** | (2006.01) |
| ***G03F 9/00*** | (2006.01) |
| ***H10W 20/00*** | (2026.01) |

(52) U.S. Cl.

CPC ........ *H10W 46/00* (2026.01); *G03F 7/70683* (2013.01); *G03F 9/7076* (2013.01); *H10W 20/069* (2026.01); *H10W 46/301* (2026.01)

(58) Field of Classification Search

None

See application file for complete search history.

(56) References Cited

U.S. PATENT DOCUMENTS

| | | | | |
|---|---|---|---|---|
| 10,290,551 | B2 | 5/2019 | Liou et al. | |
| 2006/0216923 | A1* | 9/2006 | Tran | H01L 21/76877 438/738 |
| 2013/0052793 | A1* | 2/2013 | Shieh | H10D 84/0158 257/E21.211 |
| 2023/0092256 | A1* | 3/2023 | Kobayashi | G03F 9/7076 438/401 |

FOREIGN PATENT DOCUMENTS

| | | |
|---|---|---|
| CN | 103246156 | 8/2013 |
| CN | 103797399 | 5/2014 |
| CN | 103889888 | 6/2014 |
| CN | 104281010 | 1/2015 |
| CN | 110517953 | 11/2019 |
| TW | 201334028 | 8/2013 |

* cited by examiner

*Primary Examiner* — Feifei Yeung Lopez

(74) *Attorney, Agent, or Firm* — JCIPRNET

(57) ABSTRACT

A self-aligned multiple patterning mark is provided. The mark includes a group of patterns disposed on the substrate and a cover layer. The group of patterns includes a plurality of strip patterns extending in a first direction and arranged parallel to each other, and the ends of two adjacent strip patterns are connected to each other to form an independent ring. The cover layer is disposed on the substrate and covers the group of patterns. The cover layer has an opening extending in a second direction across the first direction, and the cover layer covers two opposite ends of each strip pattern.

10 Claims, 5 Drawing Sheets

SELF-ALIGNED MULTIPLE PATTERNING MARK

CROSS-REFERENCE TO RELATED APPLICATION

This application claims the priority benefit of Taiwan application Ser. no. 111110678, filed on Mar. 22, 2022. The entirety of the above-mentioned patent application is hereby incorporated by reference herein and made a part of this specification.

BACKGROUND

Technical Field

The present invention relates to a mark for a semiconductor process, and in particular to a self-aligned multiple patterning mark.

Description of Related Art

In semiconductor manufacturing processes, alignment marks are used to check the positional alignment of a wafer or a chip, and overlay marks are used to check the alignment between the previous layer and the current layer. Typically, the alignment mark or the overlay mark is formed in the scribe line region of the substrate. After the alignment mark or the overlay mark is formed, an optical instrument is used to measure the alignment by analyzing image signals to determine whether the alignment is within the allowable range.

In the current self-aligned multiple patterning process, the alignment mark or the overlay mark with the same or similar patterns as the devices in the device region is usually formed in the scribe line region. For example, depending on the self-aligned multiple patterning process, the alignment mark or the overlay mark disposed in the scribe line region usually includes a plurality of stripe patterns and a cover layer partially covering the stripe patterns, and the cover layer has an opening exposing the stripe patterns. The cover layer located in the device region is known as a cut layer in the art. However, when using the optical instrument for the alignment measurement, the boundary of the cover layer may result in poor image signals, resulting in errors in the alignment measurement. In addition, for the alignment mark or the overlay mark, the stripe patterns exposed by the opening of the cover layer may be easily collapsed or peeled.

SUMMARY

The present invention provides a self-aligned multiple patterning mark, which may effectively avoid the problem of pattern collapsing or pattern peeling, and is beneficial to improve the accuracy of the alignment measurement.

A self-aligned multiple patterning mark of the present invention includes a first group of patterns and a cover layer. The first group of patterns is disposed on a substrate and includes a plurality of strip patterns extending in a first direction and disposed parallel to each other. The ends of two adjacent strip patterns are connected to each other to form an independent ring. The cover layer is disposed on the substrate and covers the first group of patterns. The cover layer has an opening, the opening extends in a second direction across the first direction, and the cover layer covers two opposite ends of each stripe pattern.

A self-aligned multiple patterning mark of the present invention includes a first group of patterns and a cover layer. The first group of patterns is disposed on a substrate and includes a plurality of strip patterns extending on a first direction and disposed parallel to each other. The ends of two adjacent strip patterns are connected to each other to form an independent ring. The cover layer is disposed on the substrate and covers the first group of patterns. The cover layer has a first opening and a second opening, the first opening and the second opening each extend on a second direction across the first direction, and the first opening and the second opening respectively expose a first end and a second end opposite to each other of each strip pattern.

Based on the above, in an embodiment of the present invention, since the cover layer of the self-aligned multiple patterning mark covers the ends of each of the strip patterns, the problem of collapsing or peeling of the strip patterns may be effectively avoided. In addition, since the opening of the cover layer exposes a part of each of the stripe patterns, when using the self-aligned multiple patterning mark of the present embodiment as the alignment mark or the overlay mark, through the boundary of the opening and the region exposed by the opening, the resolution of the image signals obtained by the optical instrument may be effectively improved, thereby increasing the accuracy of the alignment measurement.

In addition, in another embodiment of the present invention, since the cover layer of the self-aligned multiple patterning mark covers the portion of each of the stripe patterns other than the ends thereof, the problem of collapsing or peeling of the strip patterns may be effectively avoided. In addition, when using the self-aligned multiple patterning mark of the present embodiment as the alignment mark or the overlay mark, through the boundary of the opening and the region exposed by the opening, the resolution of the image signals obtained by the optical instrument may be effectively improved, thereby increasing the accuracy of the alignment measurement.

DESCRIPTION OF THE EMBODIMENTS

Figure 1A:
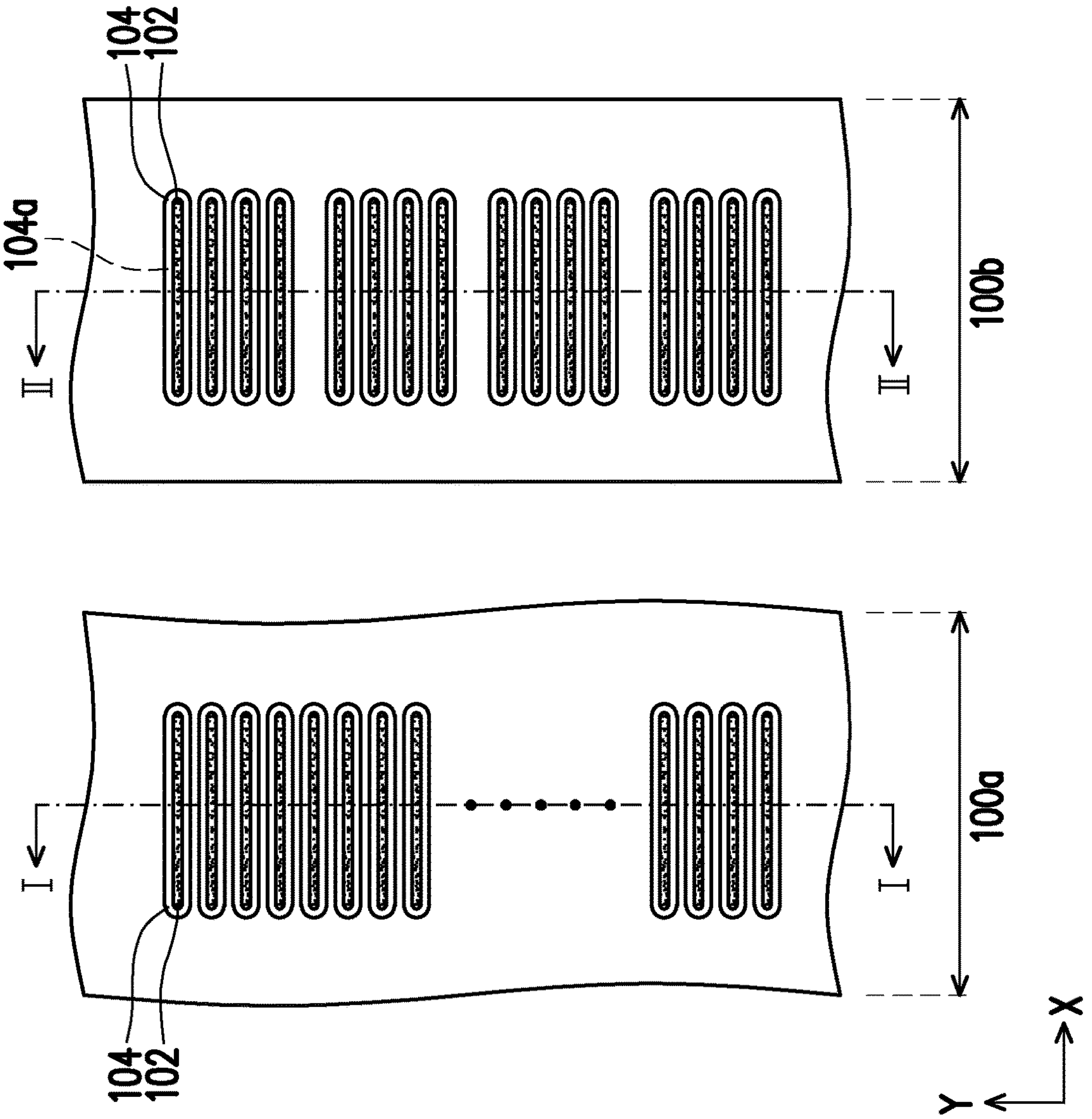
FIGS. 1A to 1B are schematic top views of the manufacturing process of the self-aligned multiple patterning mark according to the first embodiment of the present invention.

The embodiments are described in detail under with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

The self-aligned multiple patterning mark of the present invention is formed in the scribe line region of the substrate, which may be used as the alignment mark for checking the positional alignment of the wafer or the chip, or may be used as the overlay mark for checking the alignment between the previous layer and the current layer. In addition, the mark of the present invention may be formed in various self-aligned multiple patterning processes, such as the self-aligned double patterning (SADP) process, the self-aligned triple patterning (SATP) process or the self-aligned quadruple patterning (SAQP) process. The following will take SADP process as an example for description, and in this case, the mark of the present invention may be called SADP mark, but the present invention is not limited thereto.

Figure 2A:
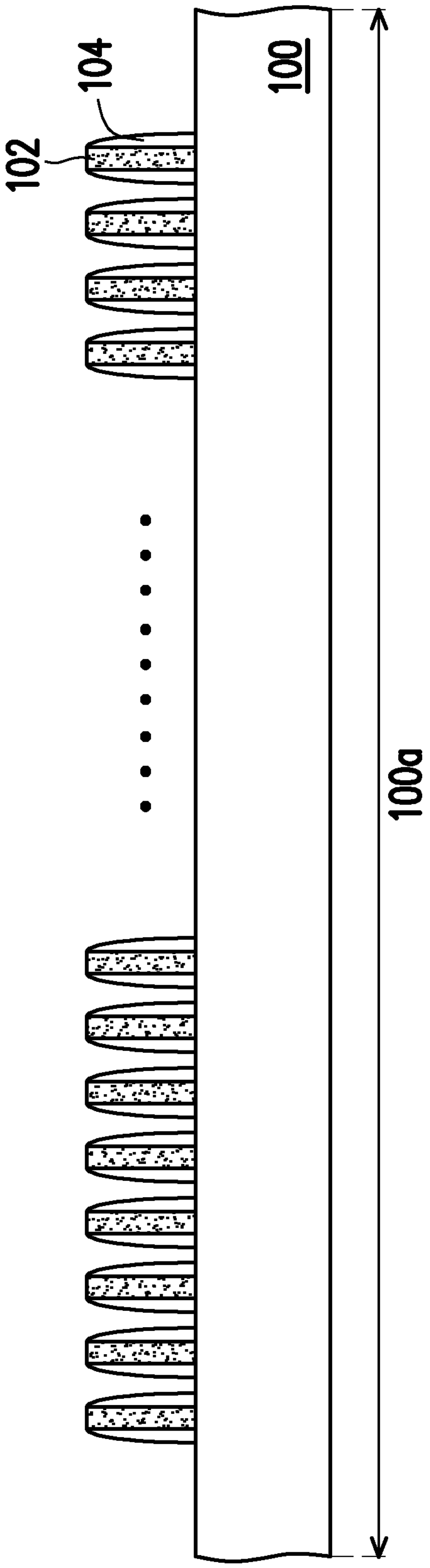
FIGS. 2A to 2B are schematic cross-sectional views along the line I-I in FIGS. 1A to 1B.
Figure 3A:
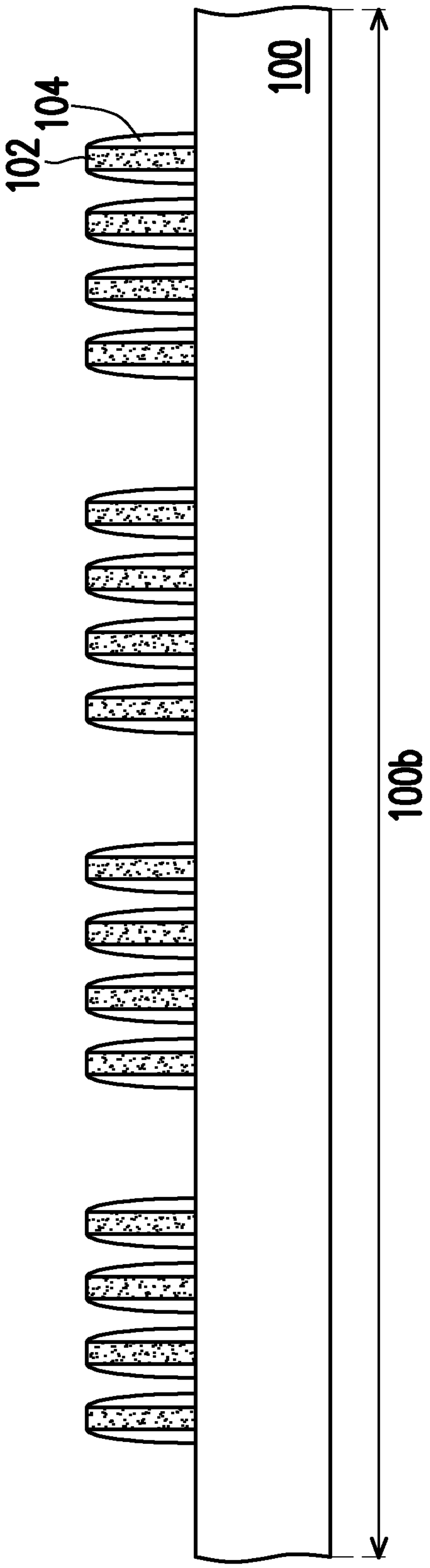
FIGS. 3A to 3B are schematic cross-sectional views along the line II-II in FIGS. 1A to 1B.

Referring to FIGS. 1A, 2A and 3A, a plurality of strip-shaped dummy patterns 102 are formed on the substrate 100. The substrate 100 is s target substrate, i.e., a substrate to be patterned. For example, the substrate 100 may be a silicon substrate, and the patterned substrate 100 may be used to define trench patterns formed in the substrate 100. Or, the substrate 100 may be a dielectric substrate, and the patterned substrate 100 may be used, for example, to define the circuit patterns formed in the substrate 100. Or, the substrate 100 may be a conductive substrate, and the patterned substrate 100 may be used, for example, to define word line structures, bit line structures and the like. However, the substrate 100 in the present invention is not limited to the above.

The substrate 100 may be divided into the device region 100*a* and the scribe line region 100*b* surrounding the device region 100*a*. The plurality of strip-shaped dummy patterns 102 are formed on the substrate 100 in the device region 100*a* and in the scribe line region 100*b*, respectively. In the present embodiment, in the device region 100*a*, each dummy pattern 102 extends in the X direction, and the dummy patterns 102 are parallel to each other in the Y direction and continuously arranged at the same pitch. In addition, in the present embodiment, in order to make the image signal of the alignment mark or the overlay mark easy to identify, in the scribe line region 100*b*, for example, four groups of dummy patterns are formed, and the four groups of dummy patterns are parallel arranged and spaced from each other in the Y direction, wherein, the distance between the adjacent two groups of dummy patterns is greater than the distance between the adjacent two dummy patterns 102 in each group. However, the present invention is not limited to the above number of the groups. In addition, in each group, each dummy pattern 102 extends in the X direction, and the layouts of the groups are the same.

Then, the spacers 104 are formed on the sidewalls of each of the dummy patterns 102. From the top-view, the spacers 104 surround each of the dummy patterns 102. A method for forming the spacers 104, for example, includes the following steps. A spacer material layer is conformally formed on the substrate 100. An anisotropic etching process is performed to remove a horizontal part of the spacer material layer.

Figure 1B:
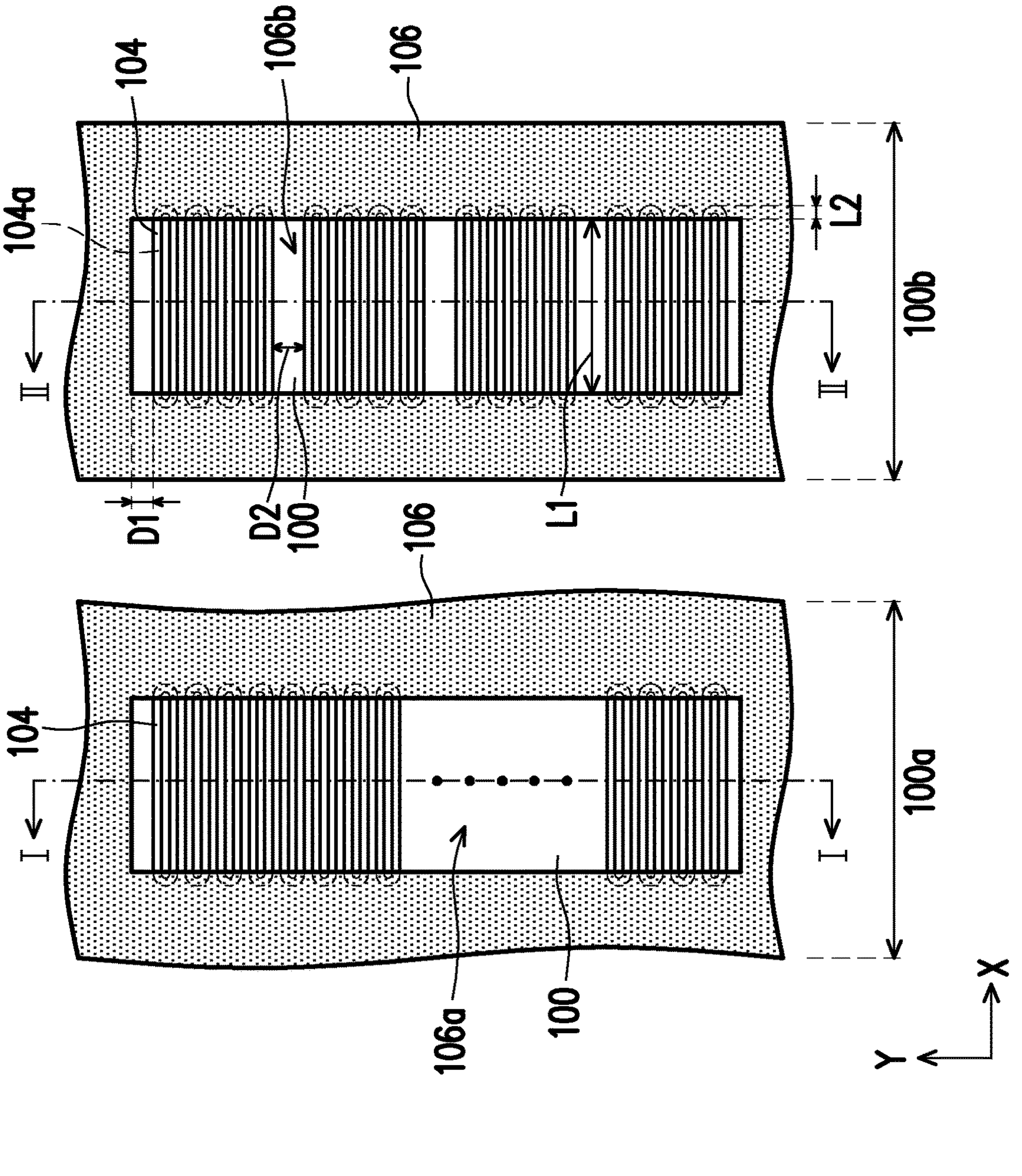
Figure 2B:
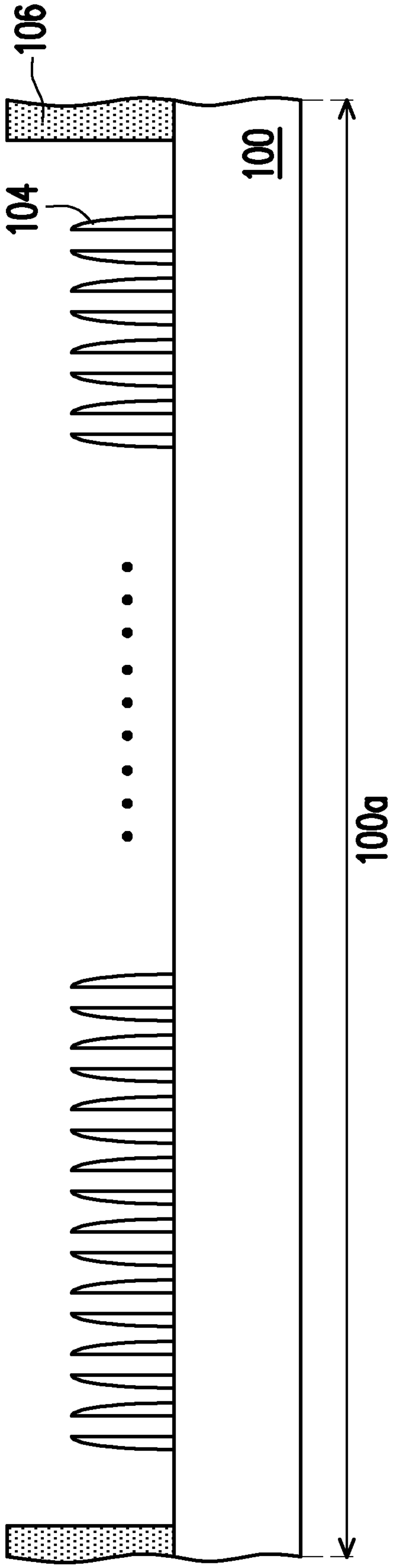
Figure 3B:
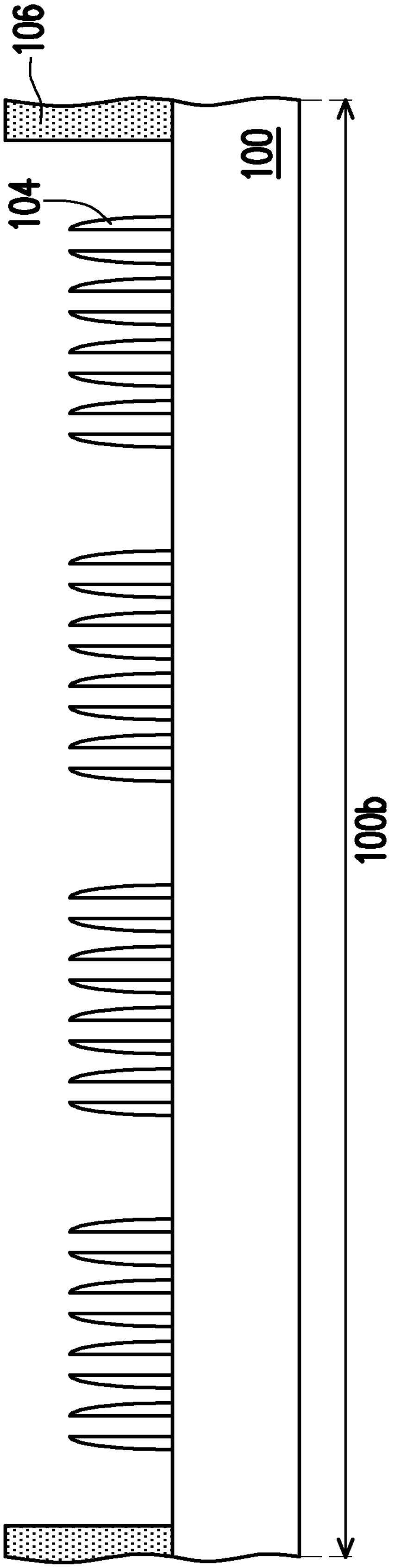

Referring to FIGS. 1B, 2B and 3B, the dummy patterns 102 are removed. At this time, in the device region 100*a*, the spacers 104 remaining on the substrate 100 may be used as a mask pattern for the self-aligned double patterning process. In detail, after the dummy patterns 102 are removed, a plurality of stripe patterns 104*a* formed by the spacers 104 and arranged in parallel are formed on the substrate 100. The ends of two adjacent stripe patterns 104*a* are connected to each other to form an independent ring. In the present embodiment, four groups of patterns are formed in the scribe line region 100*b*, and each group of patterns includes four elongated annular patterns. In addition, the groups of patterns are disposed on the substrate 100 in parallel with each other, and the groups of patterns are identical to each other. The distances between two adjacent stripe patterns 104*a* in each group of patterns are equal. The distance between the adjacent two groups of patterns is greater than the distance between the two adjacent strip patterns 104*a* in each group, so that the adjacent two groups of patterns may be clearly distinguished.

Next, a cover layer 106 is formed on the substrate 100. In the present embodiment, the cover layer 106 is, for example, a photoresist layer, but the present invention is not limited thereto. The cover layer 106 has opening 106*a* in the device region 100*a* and an opening 106*b* in the scribe line region 100*b* to expose a part of the elongated annular patterns formed by the spacers 104. In detail, in the device region 100*a*, the cover layer 106 covers the ends of each elongated annular pattern formed by the spacers 104, and the opening 106*a* exposes the stripe patterns 104*a*. In addition, in the scribe line region 100*b*, the cover layer 106 covers the ends of each elongated annular pattern formed by the spacers 104, and the opening 106*b* exposes the stripe patterns 104*a*. In this way, the SADP mark of the present embodiment is formed in the scribe line region 100*b*, which includes the stripe patterns 104*a* and the cover layer 106. That is, the manufacturing of the SADP mark of the present embodiment is integrated into the SADP process in the device region. After that, the subsequent processes may be performed. For example, an anisotropic etching process may be performed by using the cover layer 106 and the exposed stripe patterns 104*a* as an etching mask to perform the self-aligned double patterning process on the substrate 100.

In the present embodiment, in the scribe line region 100*b*, the cover layer 106 covers the ends of each elongated annular pattern formed by the spacers 104, so that the problem of collapsing or peeling of the elongated annular patterns may be effectively avoided. In addition, the opening 106*b* of the cover layer 106 exposes the stripe patterns 104*a*. According to an embodiment of the present invention, in the X direction, i.e., the extending direction of the stripe pattern 104*a*, the ratio of the length L1 of the stripe pattern 104*a* to the length L2 of the end of the annular pattern covered by the cover layer 106, L1/L2, is greater than 18. According to an embodiment of the present invention, in the Y direction, i.e., the extending direction of the opening 106*b*, the ratio of the distance D2 between the adjacent two groups of dummy patterns to the distance D1 between the boundary of the opening 106*b* and the adjacent strip pattern 104*a*, D2/D1, is greater than 1 and less than 5. According to an embodiment of the present invention, the ratio of the distance D1 between the boundary of the opening 106*b* and the adjacent strip pattern 104*a* to the length L2 of the end of the annular pattern covered by the cover layer 106, D1/L2, is greater than 2. In this way, when the mark of the present embodiment is used as the alignment mark or the overlay mark, the resolution of the image signal obtained by the optical instrument may be effectively improved, thereby increasing the accuracy of the alignment measurement.

Figure 4:
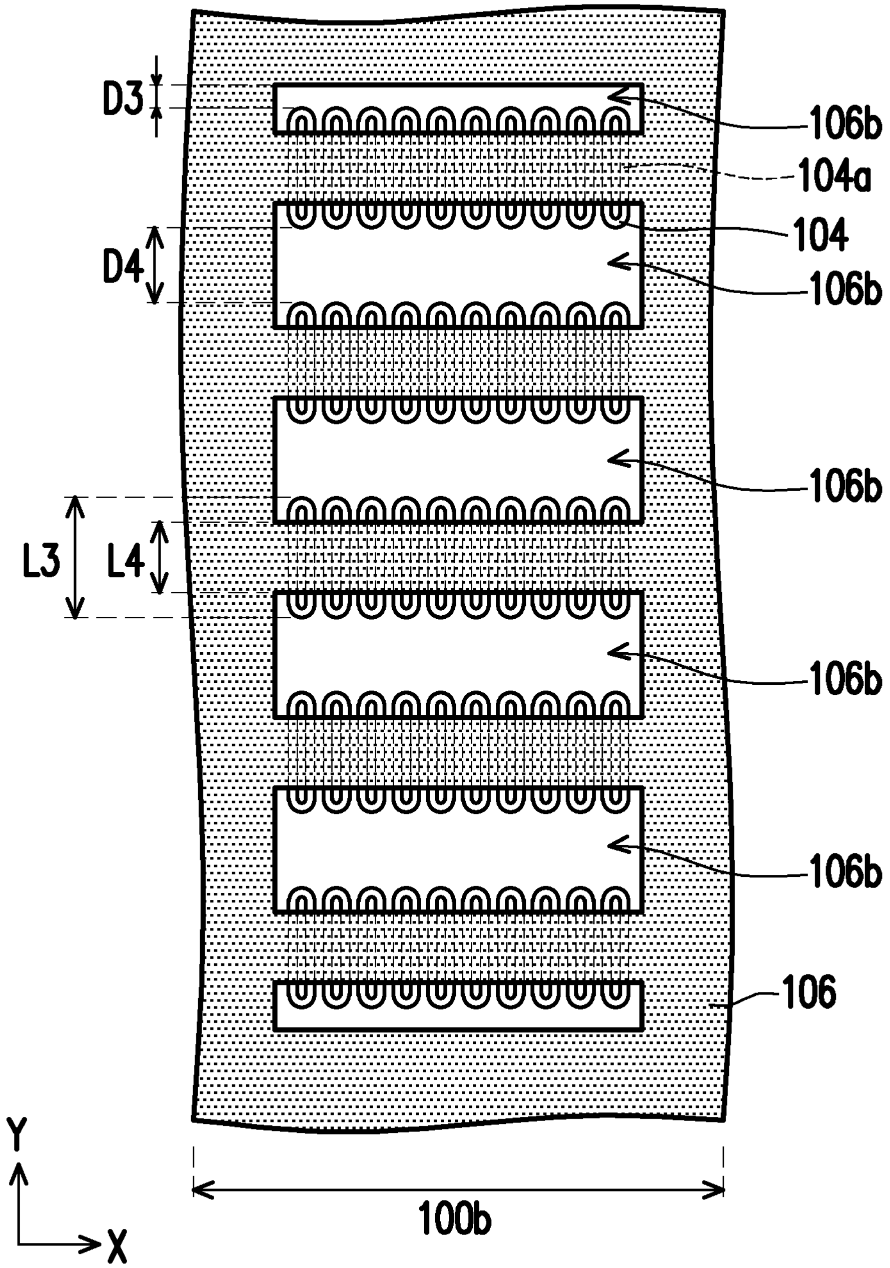
FIG. 4 is a schematic top view of the self-aligned multiple patterning mark according to the second embodiment of the present invention.

FIG. 4 is a schematic top view of the self-aligned multiple patterning mark according to the second embodiment of the present invention. The difference between the present embodiment and the first embodiment lies in the arrangements of the elongated annular patterns in the scribe line region and the openings of the cover layer. Therefore, in the present embodiment, the same device and process as the first embodiment will not be further described.

Referring to FIG. 4, in the present embodiment, from the top view, each elongated annular pattern formed by the spacers 104 extends in the Y direction. That is, the strip patterns 104*a* extend in the Y direction, and the ends of two adjacent strip patterns 104*a* are connected to each other to form an independent ring. In addition, a plurality of stripe patterns 104*a* are arranged in parallel to each other and continuously in the X direction to constitute a group of patterns.

The mark of the present embodiment includes five groups of patterns, which are arranged parallel to each other in the Y direction, and the layouts of the groups are the same. Each group of patterns includes ten elongated patterns. That is, each group of patterns includes 20 strip patterns 104*a* and the ends of two adjacent strip patterns 104*a* are connected to each other to form an independent ring. However, the present invention is not limited to the above numbers of the groups and the patterns. In each group of patterns, the distances between two adjacent strip patterns 104*a* are equal.

In addition, in the present embodiment, in the scribe line region 100*b*, the cover layer 106 has a plurality of openings 106*b*. The openings 106*b* are arranged parallel to each other in the Y direction, and each opening 106*b* extends in the X direction. The openings 106*b* respectively expose two opposite ends of strip patterns 104*a*. That is, the openings 106*b* expose the parts where two adjacent strip patterns 104*a* are connected to each other. Among the openings 106*b*, one opening 106*b* may expose the ends of the strip patterns 104*a* opposite to each other in the adjacent two groups of patterns. In other words, as shown in FIG. 4, for adjacent two groups of patterns, the end of the strip pattern 104*a* in one group of patterns and the adjacent end of the strip pattern 104*a* in the other group of patterns may be exposed by the same opening 106*b*. In the present embodiment, from the top view, the ratio of the distance D4 between the adjacent two groups of patterns in the Y direction, i.e., the extending direction of the strip patterns 104*a*, to the distance D3 between the boundary of the opening 106*b* and the adjacent spacers 104, D4/D3, is greater than 1 and less than 5, so that the adjacent two groups of patterns may be clearly distinguished.

In the present embodiment, the cover layer 106 covers the portion of each of the stripe patterns 104*a* other than the ends thereof in each group of patterns. In the present embodiment, the ratio of the length L3 of the annular pattern to the length L4 of the stripe pattern 104*a* covered by the cover layer 106, L3/L4, is greater than 1 and less than 2. In this way, the problem of collapsing or peeling of the elongated annular patterns may be effectively avoided. In particular, for the annular pattern with a short length, for example, less than 800 nm, since the cover layer 106 is covered thereon, collapsing or peeling may be more effectively prevented.

In the present embodiment, since the cover layer 106 has a plurality of openings 106*b* arranged in parallel, the openings 106*b* respectively expose two opposite ends of the stripe patterns 104*a* and the cover layer 106 covers the portion of each of the stripe patterns 104*a* other than the ends thereof in each group of patterns, when the mark of the present embodiment is used as the alignment mark or the overlay mark, through the boundary of the opening 106*b* and the region exposed by the opening 106*b*, the resolution of the image signals obtained by the optical instrument may be effectively improved, thereby increasing the accuracy of the alignment measurement It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A self-aligned multiple patterning mark, comprising:

a first group of patterns, disposed on a substrate and comprising a plurality of strip patterns each extending in a first direction, wherein ends of two adjacent ones of the plurality of strip patterns are connected to each other to form an independent ring;

a second group of patterns same as the first group of patterns, wherein the first group of patterns and the second group of patterns are disposed on the substrate parallel to each other in a second direction in which the plurality of strip patterns are arranged, the second direction is different from the first direction, and a distance between the first group of patterns and the second group of patterns is greater than a distance between two adjacent ones of the plurality of strip patterns in the first group of patterns; and a cover layer, disposed on the substrate and covering top surfaces of the ends of the plurality of strip patterns, wherein an opening in the cover layer extends in the second direction, so as to expose portions of the plurality of strip patterns except for the ends, wherein each boundary of the opening at ends of the opening is spaced from a respective adjacent one of the plurality of strip patterns.

2. The self-aligned multiple patterning mark of claim 1, wherein distances between two adjacent ones of the plurality of strip patterns in the first group of patterns are equal.

3. The self-aligned multiple patterning mark of claim 1, wherein, in the first direction, a ratio of the length of each of the plurality of strip patterns to the length of the end of each of the plurality of strip patterns covered by the cover layer is greater than 18.

4. The self-aligned multiple patterning mark of claim 1, wherein a ratio of the distance between the first group of patterns and the second group of patterns to the distance between the boundary of the opening at the ends of the opening and an adjacent strip pattern is greater than 1 and less than 5.

5. The self-aligned multiple patterning mark of claim 4, wherein a ratio of the distance between the boundary of the opening at the ends of the opening and the adjacent strip pattern to the length of the end of each of the plurality of strip patterns covered by the cover layer is greater than 2.

6. A self-aligned multiple patterning mark, comprising:

a first group of patterns, disposed on a substrate and comprising a plurality of strip patterns extending on a first direction and disposed parallel to each other, wherein ends of two adjacent ones of the plurality of strip patterns are connected to each other to form an independent ring; and a cover layer, disposed on the substrate and covering the first group of patterns, wherein the cover layer has a first opening and a second opening, the first opening and the second opening each extend on a second direction across the first direction, and the first opening and the second opening respectively expose a first end and a second end opposite to each other of each of the plurality of strip patterns, and the cover layer covers rest of each of the plurality of strip patterns except the first end and the second end.

7. The self-aligned multiple patterning mark of claim 6, wherein distances between two adjacent ones of the plurality of strip patterns in the first group of patterns are equal.

8. The self-aligned multiple patterning mark of claim 6, further comprising a second group of patterns, wherein the first group of patterns and the second group of patterns are disposed on the substrate parallel to each other in the first direction, the second group of patterns is the same as the first group of patterns, and the cover layer further has a third opening, wherein the first opening exposes the first end of each of the plurality of stripe patterns in the first group of patterns, the second opening exposes the second end of each of the plurality of stripe patterns in the first group of patterns and one end of each strip pattern in the second group of patterns, and the third opening exposes the other end of each strip pattern in the second group of patterns.

9. The self-aligned multiple patterning mark of claim 8, wherein in the first direction, a ratio of the distance between the first group of patterns and the second group of patterns to the distance between the boundary of one of the first opening and the third opening and an adjacent one of the independent ring is greater than 1 and less than 5.

10. The self-aligned multiple patterning mark of claim 9, wherein a ratio of the length of the independent ring to the length of the stripe pattern covered by the cover layer is greater than 1 and smaller than 2.

* * * * *